US010697751B2

(12) United States Patent
Hoell, Jr. et al.

(10) Patent No.: US 10,697,751 B2
(45) Date of Patent: Jun. 30, 2020

(54) ROTATING SHAFT POSITION ENCODER SYSTEM

(71) Applicant: Segway Inc., Bedford, NH (US)

(72) Inventors: Joseph A. Hoell, Jr., Dunbarton, NH (US); James B. Carter, Pelham, NH (US)

(73) Assignee: Segway, Inc., Bedford, NH (US)

( * ) Notice: Subject to any disclaimer, the term of this patent is extended or adjusted under 35 U.S.C. 154(b) by 0 days.

(21) Appl. No.: 15/848,778

(22) Filed: Dec. 20, 2017

(65) Prior Publication Data

US 2018/0172421 A1    Jun. 21, 2018

Related U.S. Application Data

(60) Provisional application No. 62/437,374, filed on Dec. 21, 2016.

(51) Int. Cl.
| G01B 7/00 | (2006.01) |
| G01R 33/00 | (2006.01) |
| G01D 5/14 | (2006.01) |
| H02P 7/28 | (2016.01) |

(52) U.S. Cl.
CPC ............. *G01B 7/003* (2013.01); *G01D 5/145* (2013.01); *G01D 5/147* (2013.01); *G01R 33/0094* (2013.01); *H02P 7/28* (2013.01); *G01R 33/0011* (2013.01)

(58) Field of Classification Search
None
See application file for complete search history.

(56) References Cited

U.S. PATENT DOCUMENTS

| 5,883,567 A | 3/1999 | Mullins |
| 8,089,233 B2 | 1/2012 | Kanekawa et al. |
| 2009/0315547 A1* | 12/2009 | Abwa .................... G01R 33/02 324/244 |

FOREIGN PATENT DOCUMENTS

| DE | 102004047784 A1 | 4/2006 |
| DE | 102010004830 A1 | 7/2011 |

OTHER PUBLICATIONS

International Search Report and Written Opinion from related PCT Application No. PCT/US2017/067490 dated Mar. 9, 2018.

* cited by examiner

*Primary Examiner* — Jermele M Hollington
*Assistant Examiner* — Suresh K Rajaputra
(74) *Attorney, Agent, or Firm* — Burns & Levinson, LLP; Joseph M. Maraia

(57) ABSTRACT

Different approaches for providing increased redundancy in determining a position of a rotating member, for example, a motor shaft, with galvanically isolated sensors. In one aspect, two separate on-axis sensing chips are positioned in line with one another on a PCB but each on opposite sides or surfaces of the PCB. Respective sensing surfaces are essentially parallel to one another. Advantageously, greater electrical isolation is provided by placing the two sensors on opposite sides of the PCB.

22 Claims, 8 Drawing Sheets

ROTATING SHAFT POSITION ENCODER SYSTEM

RELATED APPLICATION

This application claims priority to U.S. provisional patent Application No. 62/437,374 entitled "Rotating Shaft Position Encoder System" filed Dec. 21, 2016.

FIELD OF THE INVENTION

The disclosure relates to position sensing of a rotating shaft.

BACKGROUND OF THE INVENTION

In many systems, proper operation requires information regarding the position of a rotating, or partially rotating, component such as on a steering column or a throttle. Known propulsion systems use redundant motors and drives where it is necessary to determine the position of a rotor shaft to ensure proper operation.

As shown in FIG. 1, a motor 100 includes a rotor shaft 102 with a magnetic wheel 104 attached to the rotor shaft 102. A printed circuit board (PCB) 106 includes a number of Hall effect sensors 108, for example six (6) sensors, to determine a position of the rotor shaft 102 by detecting the orientation of the magnetic field of the spinning magnetic wheel 104. As known, the rotational position of the rotor shaft 102 is used to control the current that is commanded to the various phase windings of the motor. It is critical that an accurate position of the rotor 102 be known in order to provide currents to the motor windings that are in phase with the magnetic fields.

An "on-axis" magnetic encoder or sensor 200 is known in the field of position sensing, as shown in FIG. 2. The sensor detects a magnetic field and one such sensor is the AS5047P "14-Bit On-Axis Magnetic Rotary Position Sensor" from austriamicrosystems AG of Unterpremstaetten, Austria. With an on-axis encoder 200, a magnet 202 is attached to the spinning part, e.g., a motor shaft, and the sensor 200 is positioned adjacent the magnet 202 such that a magnetic field 204 from the magnet 202 is sensed in the encoder 200. In most cases, it is necessary that the magnet 202 be directly over the top, i.e., a field sensing surface, of the sensor 200 and within relatively narrow positional location and axial alignment constraints.

Some of the known "on-axis" encoders have a plurality of sensors embedded either in one integrated circuit (IC) or provided in a single package. These "multi-sensor" ICs are used in safety critical systems such as steering, throttle and brake applications. Recently, there has been a push to design safety systems that are capable, on their own, of detecting a fault and determining the best means to correct the fault. As a result, any sensor system that is used must have the ability to verify its own data. In the case of a position sensor, however, two galvanically isolated systems are needed for the system to verify the data of any individual sensor.

Several manufactures have begun to build "redundant sensors" with two galvanically isolated chips manufactured into one IC package. Such an example is the AMS S5215 "Programmable 360° Magnetic Angle Encoder with Buffered SINE & COSINE Output Signals" available from austriamicrosystems AG. The AMS S5215 includes two independent dies in one package to provide redundancy where a bottom die, which is exposed to a slightly less magnetic field, is used for a "plausibility check."

While having multiple dies in one package provides some amount of redundancy, the layout of the pins on the package prohibits a truly redundant solution. As shown in FIG. 3, the pins of the AMS S5215 integrated circuit device, for example, are arranged such that a simple short-circuit between two adjacent pins, such as pins 27 and 28 for receiving the digital and analog power, respectively, or a high voltage pulse to a set of adjacent pins, could short circuit and destroy both sensors in the package.

What is needed is a system for providing redundant and reliable position sensing of a rotating component.

SUMMARY OF THE INVENTION

In one aspect of the present disclosure, a system for detecting rotation of a component comprises a magnet having a magnetic field coupled to the component; a substrate having a first surface and a second surface; a first magnetic field sensor provided on the first surface of the substrate; and a second magnetic field sensor provided on the second surface of the substrate and directly opposite the first magnetic field sensor, wherein a field sensing surface of the first magnetic field sensor is positioned closer to the magnet than a field sensing surface of the second magnetic field sensor.

A layer of magnetic material may be disposed over the field sensing surface of the second magnetic field sensor. In addition, a layer of non-magnetic material may be disposed between the field sensing surface of the second magnetic sensor and the magnetic material layer.

In another aspect of the present disclosure, a system for detecting a magnetic field comprises a substrate having first and second surfaces; a first magnetic field sensor provided on the first surface of the substrate, the first magnetic sensor configured to detect a first portion of the magnetic field; a second magnetic field sensor provided on the second surface of the substrate configured to detect a second portion of the magnetic field; and a layer of magnetic material provided on the second magnetic field sensor, wherein the first magnetic field portion is stronger than the second magnetic field portion.

The system may include a magnet to provide the magnetic field, wherein the first magnetic field portion is closer to the magnet than the second magnetic field portion.

In another aspect of the present disclosure, a system for detecting rotation of a component comprises a magnet having a magnetic field mounted on the component; a substrate having first and second surfaces; and first and second magnetic field sensors provided on the substrate, wherein the first and second magnetic field sensors are positioned to each measure the magnetic field in respective locations that have substantially a same magnetic field strength.

BRIEF DESCRIPTION OF THE DRAWINGS

One or more aspects of the present disclosure are discussed below with reference to the accompanying Figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, however, not every component may be labeled in every drawing. The Figures are provided for the purposes of illustration and explanation and are not intended to be limiting. In the Figures.

DETAILED DESCRIPTION

This application claims priority to U.S. provisional patent Application No. 62/437,374 entitled "Rotating Shaft Position Encoder System" filed Dec. 21, 2016, the entire contents of which is hereby incorporated by reference for all purposes.

In the following detailed description, numerous specific details are set forth in order to provide a thorough understanding of the aspects and implementations of the present disclosure. It will be understood by those of ordinary skill in the art that these may be practiced without some of the specific details that are set forth. In some instances, well-known methods, procedures, components and structures may not have been described in detail so as not to obscure the details of the implementations of the present disclosure.

Generally, as will be described below in more detail, various aspects of the present disclosure provide for, among others, different approaches to providing for increased redundancy in determining a position of a rotating member, for example, a motor shaft, with galvanically isolated magnetic field sensors to detect changes in a local magnetic field.

Figure 1:
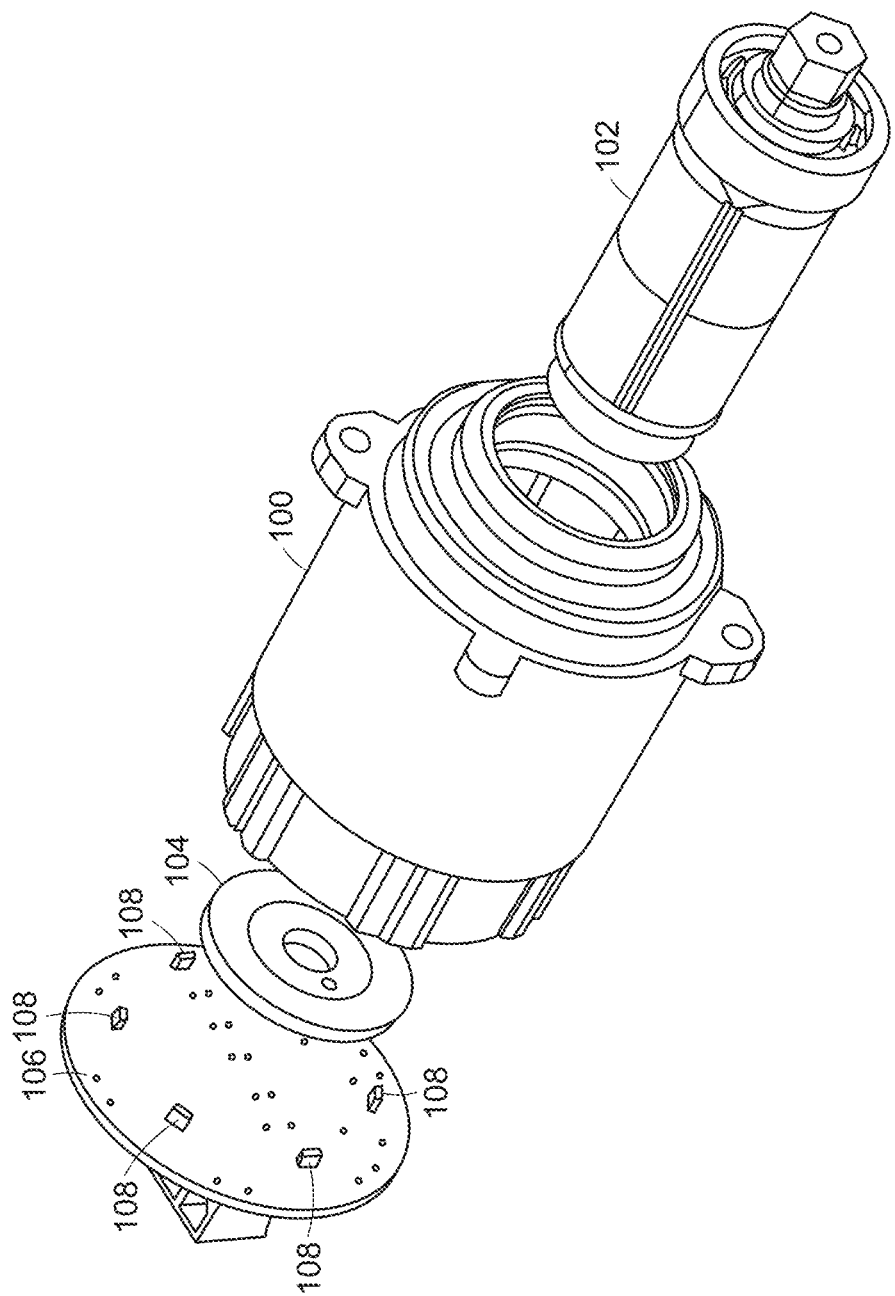
FIG. 1 is a perspective view of a known motor with a sensing component.
Figure 2:
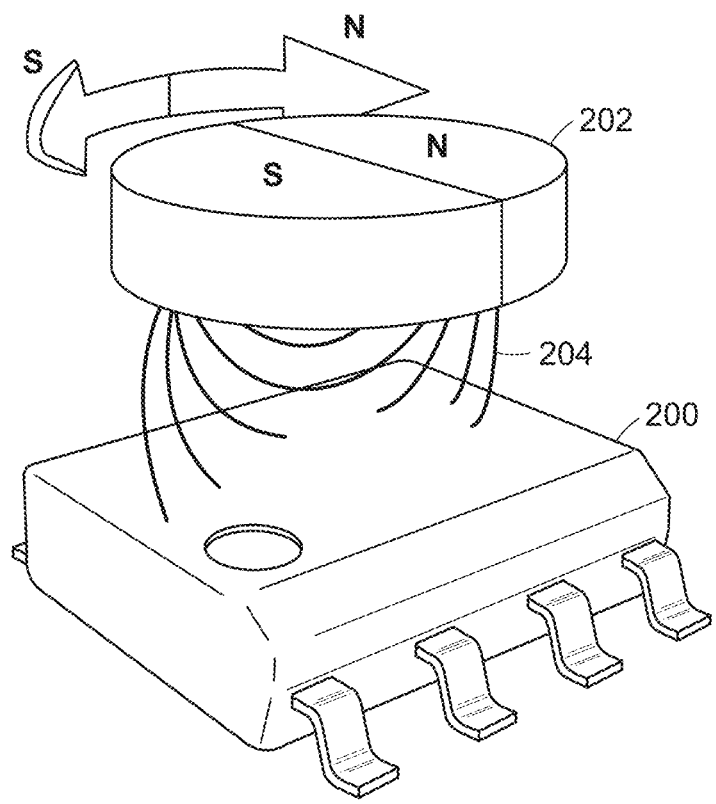
FIG. 2 is a perspective view of a known on-axis sensor and sensing magnet.
Figure 3:
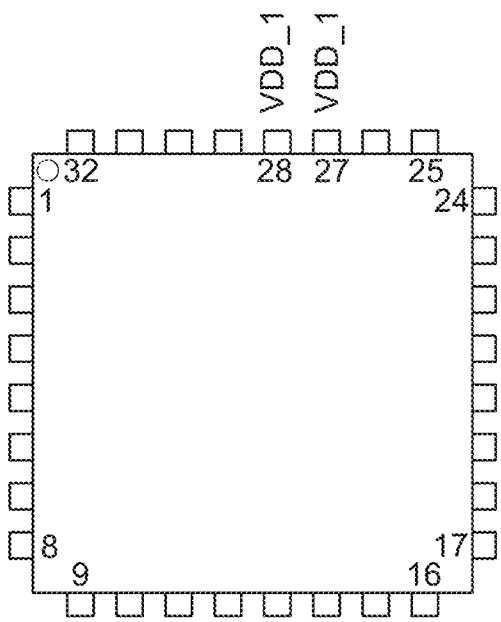
FIG. 3 is a top view of a pin assignment diagram of a known on-axis sensor.
Figure 4:
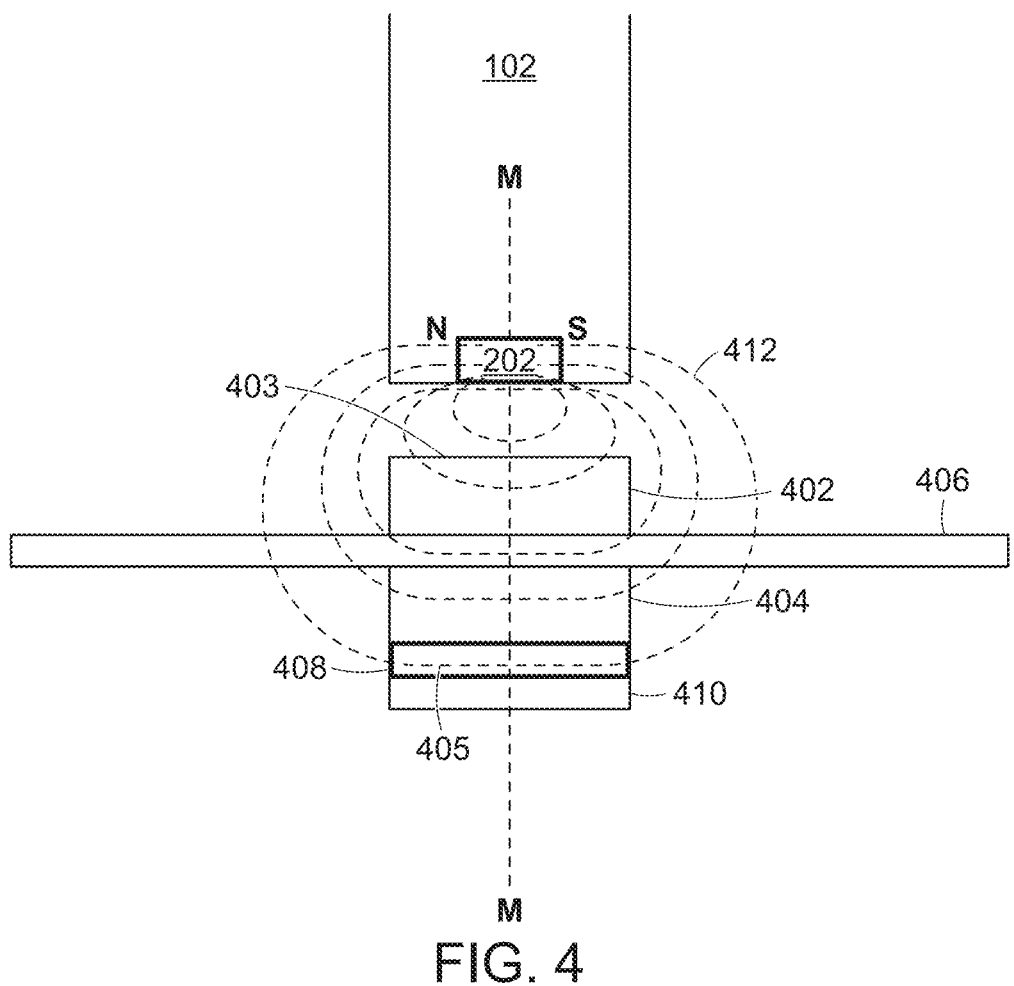
FIG. 4 is a block diagram illustrating a magnetic position detection system for a motor sensor.

In one aspect of the present disclosure, two separate on-axis sensing chips are positioned in line with one another, as shown in FIG. 4. A PCB 406 is provided with first and second on-axis sensors 402 and 404 aligned with one another but each on opposite sides or surfaces of the PCB 406. As shown, the respective sensing surfaces 403, 405 are essentially parallel to one another and positioned along an axis M-M. Advantageously, a full 500 VDC or greater of electrical isolation is provided by placing the two sensors 402 and 404 on opposite sides of the PCB 406.

In one example of operation, a magnet 202 is provided at an end of a motor shaft 102 and the PCB 406 is positioned such that the magnet 202 is positioned adjacent the sensing surface 403 of the first sensor 402. As a result, each of the first and second sensors 402 and 404 detects rotating magnetic field lines 412 and, therefore, the position of the motor shaft 102. A distance between the sensing surface 403 of the first sensor 402 and the magnet 202 is generally not greater than six (6) mm.

It is noted that placing the second sensor 404 on the other side of the PCB 406, e.g., farther away from the magnet 202 than the first sensor 402, reduces the strength of the magnetic field 412 received at the second sensor 404 as compared to the first sensor 402. It would be problematic if the second sensor 404 did not have an adequate magnetic field 412 to measure.

To address the possibility of a reduced magnetic field 412 at the second sensor 404, in one aspect of the present disclosure, a layer of non-magnetic material 408 is provided on the second sensor 404 and a layer of magnetic material 410 is provided on top of the layer of non-magnetic material 408. The layer of non-magnetic material 408 may be made from, for example, plastic, or a diamagnetic material such as copper, or the like. The layer of magnetic material 410 may be a ferrous material such as iron but could be magnetic-grade steel. The thickness of the non-magnetic material layer 408 is generally not greater than five (5) mm while the thickness of the magnetic material layer 410 is generally not greater than two (2) mm.

The layer of magnetic material 410 creates a "virtual magnet" that is in phase with the magnet 202 that is attached to the end of the shaft 102 as the magnetic field lines 412 will be attracted in the layer of magnetic material 410 and are then more easily detected. In other words, the magnetic material creates a parallel and uniform magnetic field near the second sensor 404 that is in phase with the magnetic field detected by the first sensor 402.

The layer of non-magnetic material 408 does not disturb the magnetic field 412 distribution and, in one implementation, is not included and the layer of magnetic material 410 is provided directly on the second sensor 404. The thickness of the layer of non-magnetic material 408 is chosen for optimization of the strength of the magnetic field 412 going through the second sensor 404.

The PCB 406 may be manufactured according to technology well known to one of ordinary skill in the art as providing components on both sides of the PCB 406 is commonplace.

Accordingly, advantages of the rotating shaft encoding system include, but are not limited to:

(a) One magnet 202 drives two sensors 402 and 404;
(b) Well known on-axis sensors may be used;
(c) Each sensor may be "non-redundant" but, in combination, can provide a redundant system that could be used in safety critical systems; and
(d) A system of galvanically isolated, redundant magnetic position sensors is provided.

Advantageously, implementing the system with the layer of magnetic material 410 can eliminate the need to place a secondary magnet over the second sensor 404 that is mechanically attached to the same shaft 102 as the magnet 202.

Figure 5:
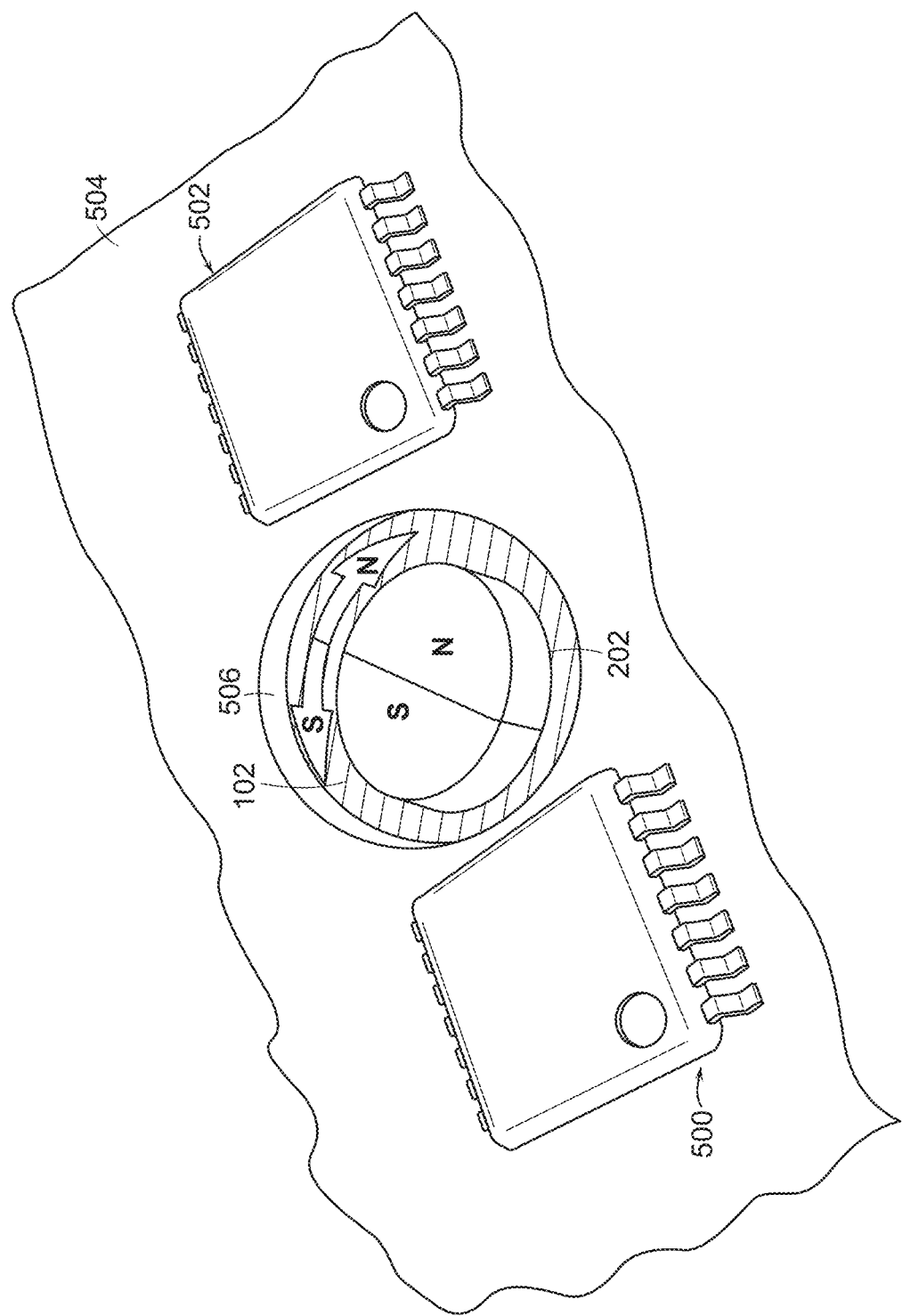
FIG. 5 is a perspective view of a magnetic position detection system that uses two linear sensors in an "off axis" configuration in accordance with an aspect of the present disclosure.

As shown in FIG. 5, two magnetic field sensors 500 and 502 are positioned on a PCB 504. An opening 506 positioned between the two sensors 500 and 502 is provided in the PCB 504. A magnet 202 on an end of a rotor 102 is positioned in the opening 506. Alternately, the PCB 504 is arranged with respect to an end of the rotor 102 so that the magnet 202 is positioned between the sensors 500 and 502 as discussed below with respect to FIGS. 7, 8A and 8C. The location of the magnet 202 is chosen such that the two magnetic field sensors 500, 502 are located in the magnetic field where the magnetic field intensity experienced by each is expected to be about equal, i.e., about the same. In other words, each of the magnetic field sensors 500, 502 is located a same distance from the magnet 202.

Each sensor 500 and 502 detects the magnetic field of the magnet 202 in order that the rotor's 102 position can be determined and each sensor 500, 502 may either be an on-axis sensor or other type of magnetic field sensor.

Figure 6:
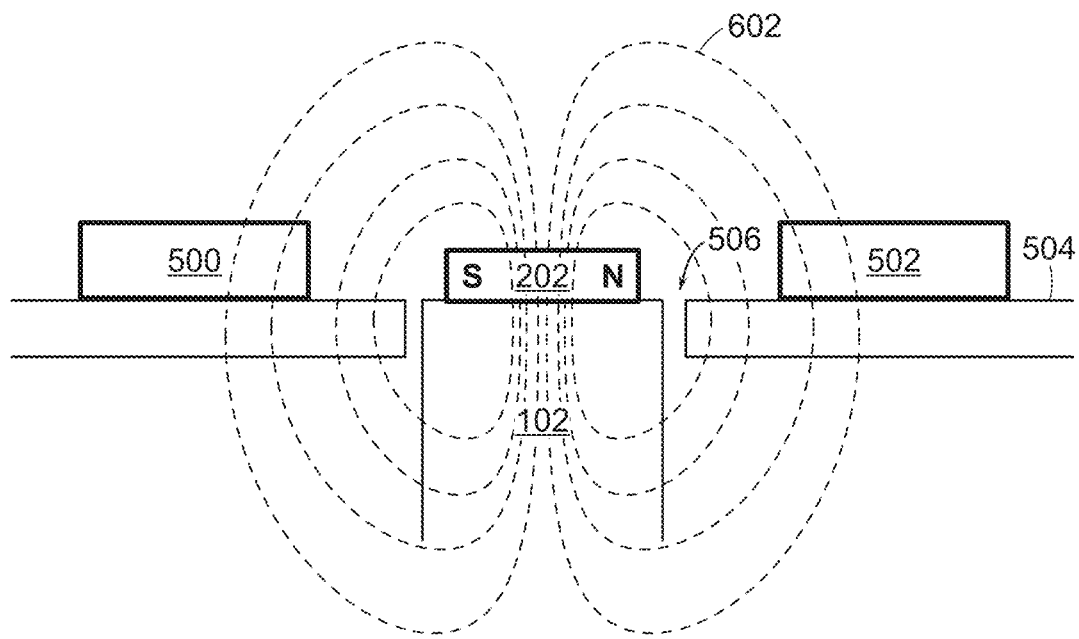
FIG. 6 is a side view of the magnetic position detection system shown in FIG. 5.

FIG. 6 is a side view of the layout of the sensors 500, 502 with respect to a magnetic field 602 of the magnet 202.

Figure 7:
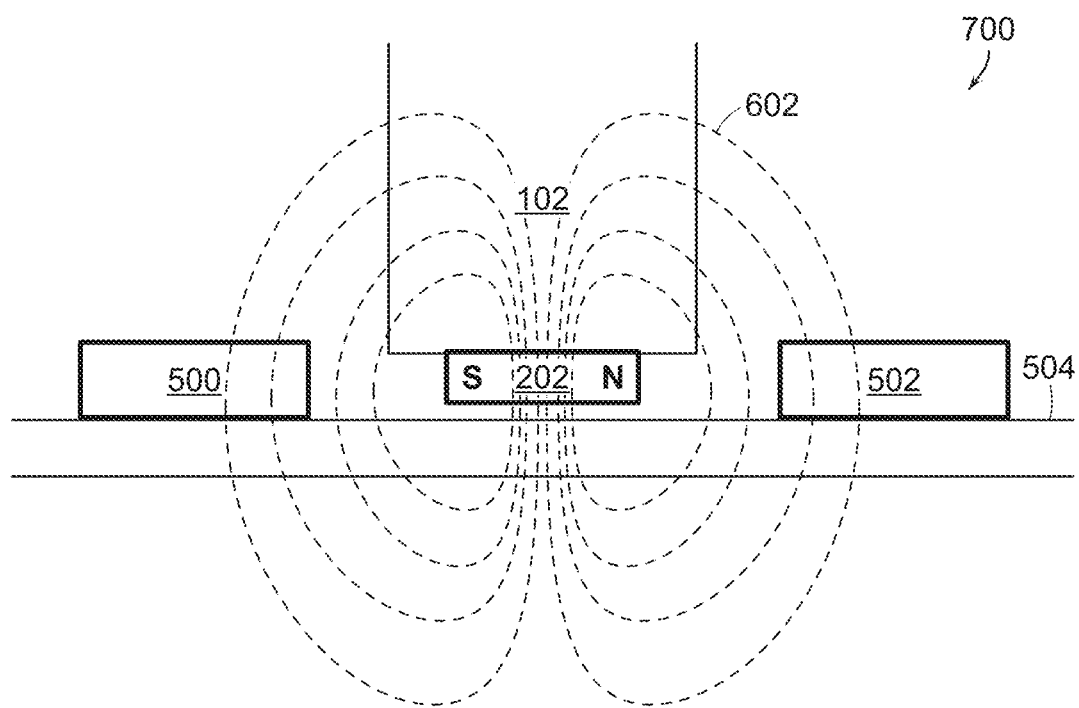
FIG. 7 is a side view of a magnetic position detection system in accordance with another aspect of the disclosure.
Figure 8A:
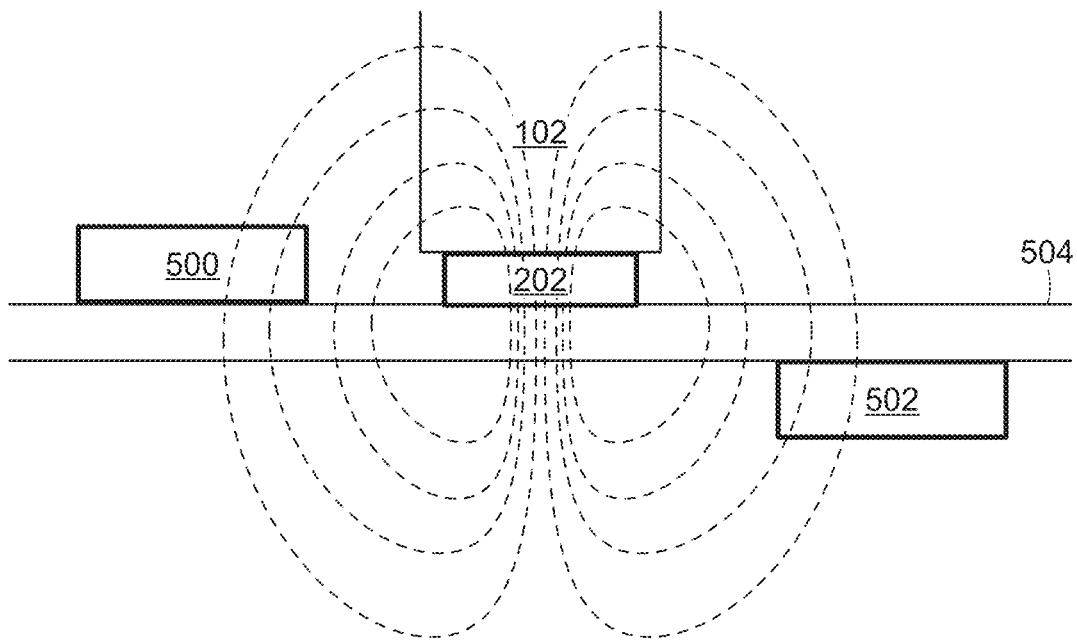
FIGS. 8A-8D are side views of arrangements of magnetic position detection systems in accordance with aspects of the disclosure.
Figure 8B:
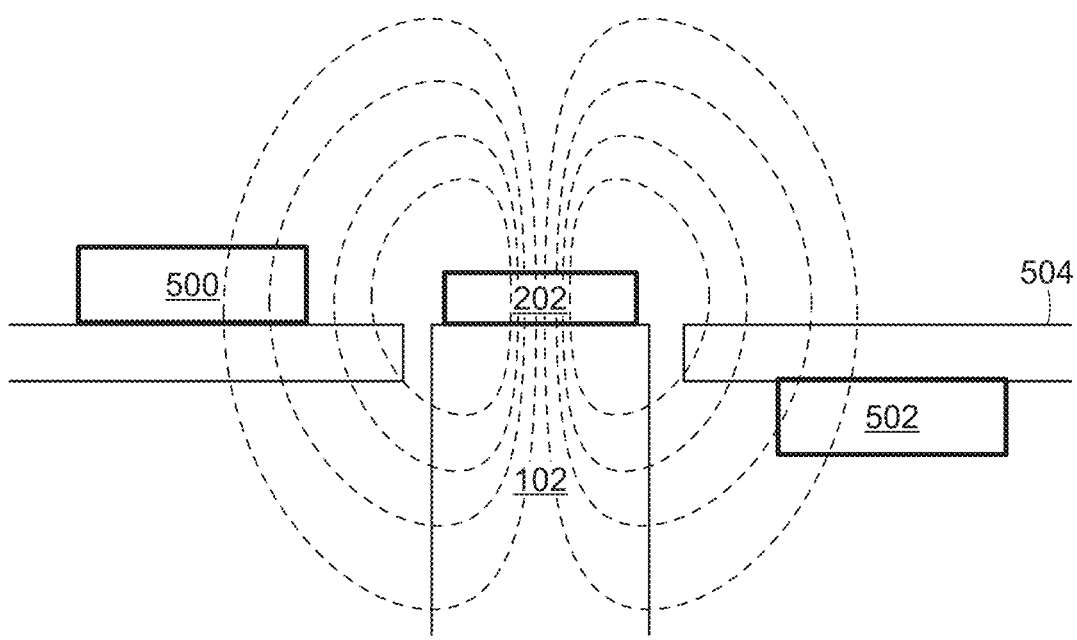

Referring now to FIG. 7, in another aspect of the present disclosure, a magnetic position detection system 700 places the magnet 202 between the sensors 500, 502 but does extend through the substrate 504 as in the system presented in FIGS. 5 and 6.

As shown in FIGS. 8A-8D, the sensors may be provided on different sides of the substrate. Thus, per FIGS. 8A and 8B, the sensors 500, 502 are provided on opposite surfaces of the substrate but generally a same distance from the magnet 202.

Figure 8C:
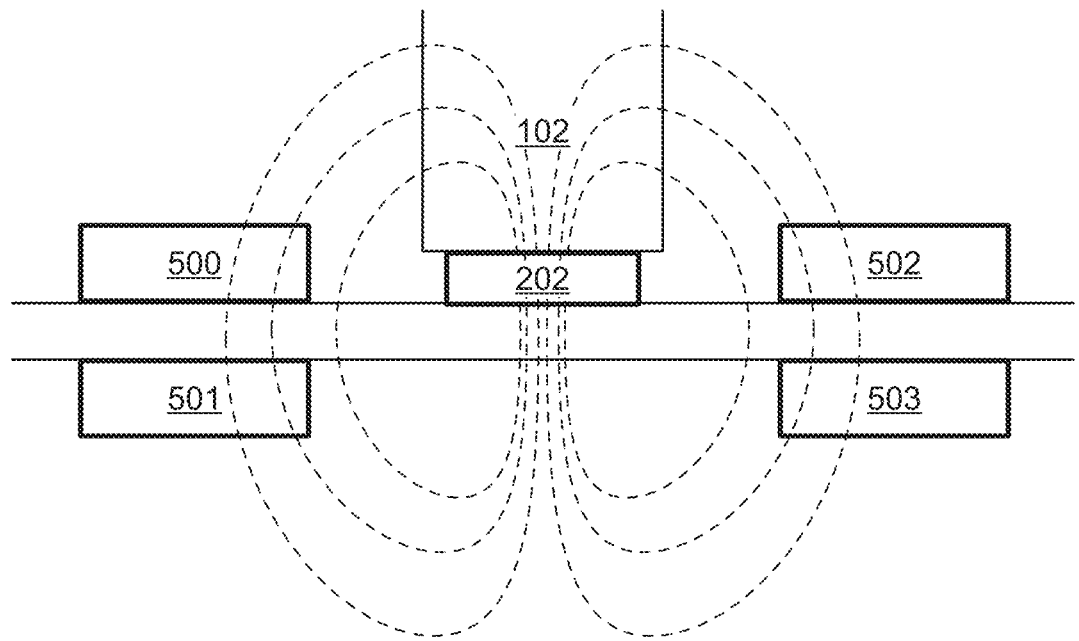
Figure 8D:
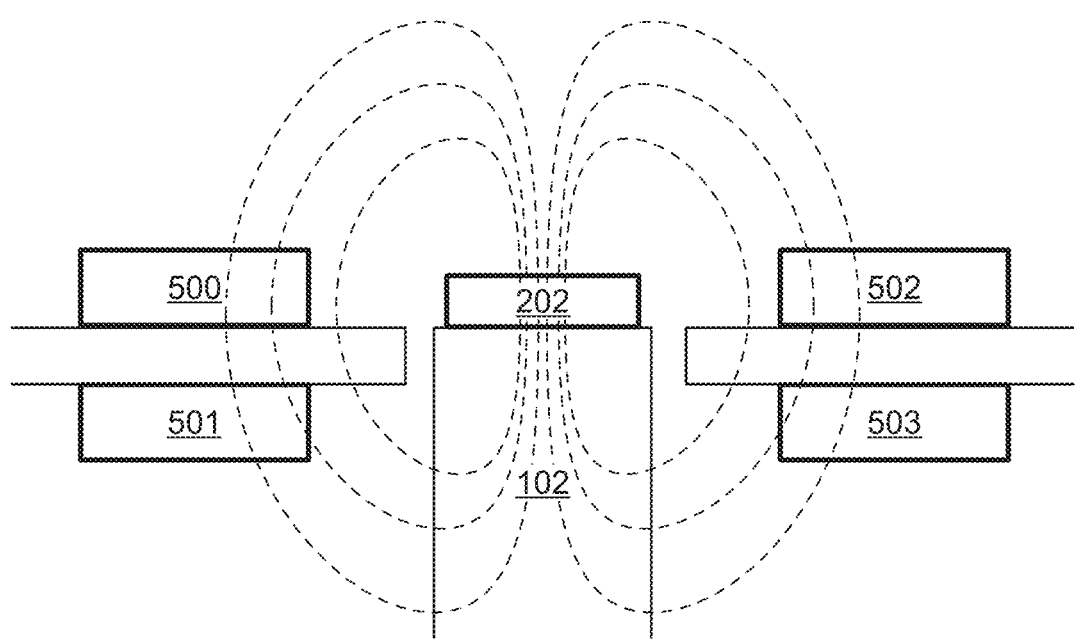

Further, per FIGS. 8C and 8D, two sensors on each surface of the substrate may be provided where the sensors 500, 502 are on one surface and the sensors 501, 503 are on the other surface of the substrate.

Figure 9:
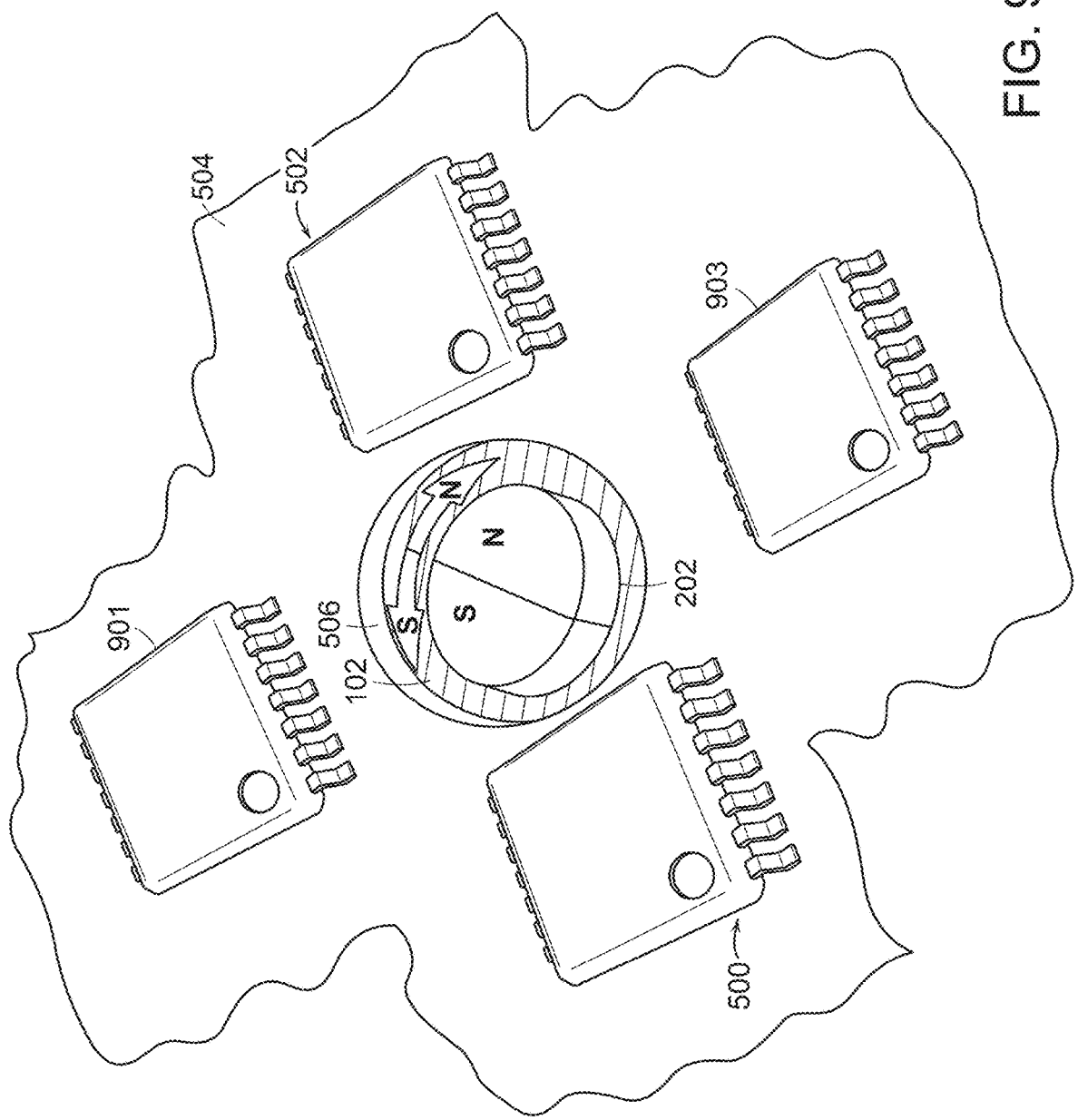
FIG. 9 is a magnetic position detection system in accordance with another aspect of the disclosure.

In another aspect of the present disclosure, a plurality of sensors are provided about the magnet. As shown in FIG. 9, four sensors 500, 502, 901, 903 are provided on the substrate 504 about the magnet 202. Each one senses the magnetic field of the magnet to determine the orientation of the rotating member or shaft 102. The location of the magnet 202 is chosen such that the magnetic field sensors 500, 502, 901, 903 are located in the magnetic field where the magnetic field intensity experienced by each is expected to be about equal, i.e., about the same. In other words, each of the magnetic field sensors 500, 502, 901, 903 is located a same distance from the magnet 202.

Of course, one of ordinary skill in the art will understand that the sensors 500, 502, 901, 903 could be alternately provided on the other surface similar to the teachings above with respect to the system shown in FIGS. 8A-8D.

In addition, where the magnetic field sensors are implemented as integrated circuits in packages with metal leads or pins, a protective conformal coating can be applied to the leads or pins. The coating minimizes the chances for a short circuit occurring between two or more pins when the I/O pins are in close proximity to one another. The coating could be, for example, an epoxy resin capable of preventing a mechanical and/or an electrical path from occurring between pins.

The coating material is capable of withstanding the voltage levels that might be seen in an environment in which the device is placed. In many motor-based systems, for example, voltages in the range of 100 VDC or higher can be found. Such voltage resistance is necessary where the leg spacing is on the order of 0.3 mm which is problematic in light of a bus voltage that is in the range 100 VDC or greater.

It is to be understood that the details of construction and the arrangement of the components set forth in the description or illustrated in the drawings are not limiting. There are other ways of being practiced or carried out. Also, it is to be understood that the phraseology and terminology employed herein are for the purpose of description only and also should not be regarded as limiting.

It is appreciated that certain features, which are, for clarity, described in the context of separate implementations, may also be provided in combination in a single implementation. Conversely, various features, which are, for brevity, described in the context of a single implementation, may also be provided separately or in any suitable sub-combination.

One of ordinary skill in the art will understand that in the Detailed Description, the sensors are mounted on the PCB and that traces and/or layers may be necessary to provide other signals, power to the devices, and/or I/O signals or support for ancillary components. In addition, while an example of detecting rotation of a rotor was set forth, one of ordinary skill in the art will understand that the teachings found herein can be applied to components that do not "fully" rotate 360° but which partially rotate, that is, rotate less than a full circle.

While various embodiments of the inventive concept have been described, it will be apparent to those of ordinary skill in the art that many more embodiments and implementations are possible that are within the scope of this disclosure.

What is claimed is:

1. A system for detecting rotation of a component, the system comprising:
   a magnet, having a magnetic field, coupled to the component;
   a substrate having a first surface and a second surface parallel to the first surface;
   a first magnetic field sensor provided on the first surface of the substrate; and
   a second magnetic field sensor provided on the second surface of the substrate and directly opposite the first magnetic field sensor,
   wherein a first field sensing surface of the first magnetic field sensor is positioned closer to the magnet than a second field sensing surface of the second magnetic field sensor,
   wherein a layer of magnetic material is disposed over the second field sensing surface of the second magnetic field sensor, and
   wherein the magnetic material layer disposed over the second field sensing surface is not a component of the second magnetic field sensor.

2. The system of claim 1, further comprising:
   a layer of non-magnetic material disposed between the second field sensing surface of the second magnetic sensor and the magnetic material layer.

3. The system of claim 2, wherein the non-magnetic material layer comprises at least one of: a plastic or a diamagnetic material.

4. The system of claim 3, wherein the diamagnetic material is copper.

5. The system of claim 2, wherein the non-magnetic material layer has a thickness not greater than 5 mm.

6. The system of claim 1, wherein the magnetic material layer comprises at least one of: a ferrous material or magnetic-grade steel.

7. The system of claim 1, wherein the magnetic material layer has a thickness not greater than 2 mm.

8. The system of claim 1, wherein the substrate is a printed circuit board (PCB).

9. The system of claim 1, wherein each of the first and second magnetic field sensors comprises an on-axis sensor.

10. A system for detecting a magnetic field, comprising:
    a substrate having first and second parallel surfaces;
    a first magnetic field sensor provided on the first surface of the substrate, the first magnetic field sensor configured to detect a first portion of the magnetic field;
    a second magnetic field sensor, provided on the second surface of the substrate, configured to detect a second portion of the magnetic field; and
    a layer of magnetic material provided on the second magnetic field sensor, wherein the magnetic material layer provided on the second magnetic field sensor is not a component of the second magnetic field sensor, and wherein the first magnetic field portion is stronger than the second magnetic field portion.

11. The system of claim 10, wherein:

the first magnetic field sensor comprises a first field sensing surface; and the second magnetic field sensor comprises a second field sensing surface, wherein the magnetic material layer covers the second field sensing surface.

12. The system of claim 11, further comprising:

a layer of non-magnetic material disposed between the second field sensing surface of the second magnetic field sensor and the magnetic material layer.

13. The system of claim 10, wherein the first and second magnetic field sensors are provided on the substrate opposite to one another.

14. The system of claim 13, wherein the first and second magnetic field sensors are aligned on a same axis.

15. The system of claim 10, further comprising:

a magnet to provide the magnetic field, wherein the first magnetic field portion is closer to the magnet than the second magnetic field portion.

16. The system of claim 12, wherein the non-magnetic material layer comprises at least one of: a plastic or a diamagnetic material and wherein the magnetic material layer comprises at least one of: a ferrous material or magnetic-grade steel.

17. A system for detecting rotation of a component having a magnet mounted thereon, comprising:

a substrate having first and second parallel surfaces; and first and second magnetic field sensors provided on the substrate, wherein the first and second magnetic field sensors are positioned on the substrate to each measure the magnetic field in respective locations that have substantially a same magnetic field strength, and wherein the substrate is positioned such that the magnet is positioned in an opening in the substrate located between the first and second magnetic field sensors.

18. The system of claim 17, wherein each of the first and second magnetic field sensors is located a same distance from the magnet.

19. The system of claim 17, wherein the first and second surfaces are opposed to one another, and wherein:

the first magnetic sensor is provided on the first surface; and the second magnetic sensor is provided on the second surface.

20. The system of claim 17, wherein:

the first and second magnetic sensors are provided on the first surface.

21. The system of claim 20, further comprising:

a third magnetic field sensor mounted on the first surface, wherein the first, second and third magnetic field sensors are positioned to each measure the magnetic field in respective locations that have substantially a same magnetic field strength.

22. The system of claim 21, wherein each of the first, second and third magnetic field sensors is located a same distance from the magnet.

* * * * *